United States Patent
Chandra et al.

(10) Patent No.: US 9,984,742 B2
(45) Date of Patent: May 29, 2018

(54) TUNABLE NEGATIVE BITLINE WRITE ASSIST AND BOOST ATTENUATION CIRCUIT

(71) Applicant: INTERNATIONAL BUSINESS MACHINES CORPORATION, Armonk, NY (US)

(72) Inventors: Dinesh Chandra, Telangana (IN); Eswararao Potladhurthi, Martur Mandal (IN); Dhani Reddy Sreenivasula Reddy, Proddatur (IN); Krishnan S. Rengarajan, Bangalore (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

(21) Appl. No.: 15/097,703

(22) Filed: Apr. 13, 2016

(65) Prior Publication Data

US 2016/0232966 A1     Aug. 11, 2016

Related U.S. Application Data

(63) Continuation of application No. 14/594,673, filed on Jan. 12, 2015, now Pat. No. 9,496,025.

(51) Int. Cl.
*G11C 11/419* (2006.01)
*G11C 7/12* (2006.01)
*G11C 11/412* (2006.01)

(52) U.S. Cl.
CPC .............. *G11C 11/419* (2013.01); *G11C 7/12* (2013.01); *G11C 11/412* (2013.01)

(58) Field of Classification Search
CPC ..... G11C 11/419; G11C 11/41; G11C 11/413; G11C 11/416

(Continued)

(56) References Cited

U.S. PATENT DOCUMENTS 7,468,903 B2   12/2008  Wang et al.
7,486,540 B2    2/2009  Gouin et al.

(Continued)

FOREIGN PATENT DOCUMENTS

EP    1780727     5/2007

OTHER PUBLICATIONS

Notice of Allowance dated Jul. 29, 2016 in related U.S. Appl. No. 14/594,673, 28 pages.

(Continued)

*Primary Examiner* — Alexander Sofocleous
*Assistant Examiner* — Alfredo Bermudez Lozada
(74) *Attorney, Agent, or Firm* — Steven Meyers; Andrew M. Calderon; Roberts Mlotkowski Safran Cole & Calderon, P.C.

(57) ABSTRACT

An apparatus and method are provided for implementing write assist with boost attenuation for static random access memory (SRAM) arrays. The apparatus includes a memory array comprising a plurality of SRAM cells. The apparatus further includes a write driver connected to each of a differential pair of bit lines in each of the plurality of SRAM cells of the memory array. The apparatus further includes a write assist attenuation circuit connected to the write driver, the write assist attenuation circuit comprising a clamping device configured to modify a control signal as a function of supply voltage and process to attenuate an amount of boost applied to pull one of the bit lines below ground in an active phase of a write cycle.

11 Claims, 10 Drawing Sheets

(58) Field of Classification Search
USPC .... 365/156, 189.011, 189.16, 189.04, 189.2, 365/154
See application file for complete search history.

(56) References Cited

U.S. PATENT DOCUMENTS

| | | | |
|---|---|---|---|
| 7,800,959 | B2 | 9/2010 | Childs et al. |
| 8,559,251 | B2 | 10/2013 | Lin et al. |
| 8,570,791 | B2 | 10/2013 | Liu |
| 8,593,890 | B2 | 11/2013 | Adams et al. |
| 9,437,281 | B2 | 9/2016 | Hsieh et al. |
| 2008/0219069 | A1* | 9/2008 | Arsovski ............ G11C 29/50 365/201 |
| 2012/0140551 | A1* | 6/2012 | Arsovski ............ G11C 7/12 365/154 |
| 2014/0160871 | A1 | 6/2014 | Zimmer et al. |
| 2015/0206576 | A1 | 7/2015 | Gong et al. |
| 2015/0255148 | A1 | 9/2015 | Roy et al. |

OTHER PUBLICATIONS

R. W. Mann et al., "Impact of circuit assist methods on margin and performance in 6T SRAM." Solid-State Electronics, vol. 54, No. 11, 2010, pp. 1398-1407.

H. Pilo et al., "A 64 Mb SRAM in 32 nm high-k metal-gate SOI technology with 0.7 V operation enabled by stability, write-ability and read-ability enhancements," IEEE Journal of Solid-State Circuits, vol. 47, No. 1, 2012, pp. 97-106.

J. Chang et al., "A 20nm 112Mb SRAM in High-K metal-gate with assist circuitry for low-leakage and low-VMIN applications," IEEE International Solid-State Circuits Conference (ISSCC), 2013, pp. 316-317.

Y.-H. Chen et al., "A 16nm 128Mb SRAM in high-K metal-gate FinFET technology with write-assist circuitry for low-VMIN applications," IEEE International Solid-State Circuits Conference (ISSCC), 2014, pp. 238-239.

Final Office Action in related U.S. Appl. No. 14/594,673, dated May 4, 2016, 12pp.

"List of IBM Patents or Patent Applications Treated as Related" 1 page.

Specification "Tunable Negative Bitline Write Assist and Boost Attenuation Circuit" for related U.S. Appl. No. 14/594,673, filed Jan. 12, 2015, 35 pages.

Office Action dated Feb. 17, 2017 in related U.S. Appl. No. 15/266,343, 15 pages.

Notice of Allowance dated Aug. 7, 2017 in related U.S. Appl. No. 15/266,343, 12 pages.

* cited by examiner

| EMA | Tuning |
|---|---|
| "00" | Default Attenuation |
| "01" | Lesser Attenuation |
| "10" | Larger Attenuation |
| "11" | Boost timing push out |

TUNABLE NEGATIVE BITLINE WRITE ASSIST AND BOOST ATTENUATION CIRCUIT

FIELD OF THE INVENTION

The invention relates to memory devices and, more particularly, to an apparatus and method for implementing write assist with boost attenuation for static random access memory (SRAM) arrays.

BACKGROUND

Memory devices are commonly employed as internal storage areas in a computer or other type of electronic equipment. One specific type of memory used to store data in a computer is random access memory (RAM), such as static RAM (SRAM) or dynamic RAM (DRAM), for example. RAM is typically used as main memory in a computer environment. RAM is generally volatile, in that once power is turned off, all data stored in the RAM is lost.

A typical SRAM device includes an array of individual SRAM cells. Each SRAM cell is capable of storing a binary voltage value therein, which voltage value represents a logical data bit (e.g., "0" or "1"). One existing configuration for an SRAM cell includes a pair of cross-coupled devices such as inverters. With complementary metal oxide semiconductor (CMOS) technology, the inverters further include a pull-up PFET (p-channel) transistor connected to a complementary pull-down NFET (n-channel) transistor. The inverters, connected in a cross-coupled configuration, act as a latch that stores the data bit therein so long as power is supplied to the memory array. In a conventional six-transistor (6T) cell, a pair of access transistors or pass gates (when activated by a word line) selectively couples the inverters to a pair of complementary bit lines. Other SRAM cell designs may include a different number of transistors, e.g., 4T, 8T, etc.

The design of SRAM cells has traditionally involved a compromise between the read and write functions of the memory cell to maintain cell stability, read performance, and write performance. The transistors which make up the cross-coupled latch must be weak enough to be overdriven during a write operation, while also strong enough to maintain their data value when driving a bit line during a read operation. The access transistors that connect the cross-coupled cell nodes to the true and complement bit lines affect both the stability and performance of the cell. In one-port SRAM cells, a single pair of access transistors is conventionally used for both read and write access to the cell. The gates are driven to a digital value in order to switch the access transistors between an on and off state. The optimization of an access for a write operation would drive the reduction of the on-resistance ($R_{on}$) for the device. On the other hand, the optimization of an access transistor for a read operation drives an increase in $R_{on}$ in order to isolate the cell from the bit line capacitance and prevent a cell disturb.

One approach to improving write performance of SRAM devices is to use so-called "negative boosting" to discharge a bit line to a voltage level below the nominal low supply rail value (e.g., ground). In so doing, the access transistors or pass gates of the SRAM cell coupled to the discharged bit line see a resultant increase in both the gate-to-source and drain-to-source voltages. This negative boosting facilitates internal node discharge and flipping of the cross-coupled latch as compared to more conventional write techniques in which the bit line is simply discharged to the value of the nominal low voltage rail (e.g., ground).

SUMMARY

In a first aspect of the invention, a device is provided for that includes a memory array comprising a plurality of SRAM cells. The device further includes a plurality of true bit lines each connected to a column of the memory array. The device further includes a plurality of complement bit lines each forming a differential pair with, and in a same column as, one of the plurality of true bit lines. The device further includes a write driver connected to each of the differential pair of bit lines in each of the plurality of SRAM cells of the memory array. The write driver includes a negative boost node and a discharge device coupled to ground and the negative boost node. The discharge device is configured to receive a control signal and pull one of the plurality of true bit lines or one of the plurality of complement bit lines to ground in an active phase of a write cycle. The write driver further includes a boost capacitor coupled to the negative boost node. The boost capacitor configured to boost the one of the plurality of true bit lines or the one of the plurality of complement bit lines below ground. The device further includes a write assist attenuation circuit connected to the discharge device, the write assist attenuation circuit comprising a clamping device configured to modify the control signal as a function of supply voltage and process to attenuate an amount of the boost.

In another aspect of the invention, a SRAM write assist attenuation circuit is provided for that includes a clamping device comprising a first NFET, a second NFET, and a third NFET connected to a control signal. The SRAM write assist attenuation circuit further includes a logic structure comprising one or more OR gates configured to generate a first attenuation signal, a second attenuation signal, and a third attenuation signal. The first attenuation signal, the second attenuation signal, and the third attenuation signal are configured to individually activate either the first NFET, the second NFET, or the third NFET such that only one of the first NFET, the second NFET, and the third NFET modify the control signal as a function of a supply voltage and a process to attenuate an amount of boost applied to pull one of a plurality of true bit lines or one of a plurality of complement bit lines below ground in an active phase of a write cycle.

In a further aspect of the invention, a SRAM device is provided for that includes a memory array comprising a plurality of SRAM cells. The SRAM device further includes a plurality of true bit lines each connected to a column of the memory array. The SRAM device further includes a plurality of complement bit lines each forming a differential pair with, and in a same column as, one of the plurality of true bit lines. The SRAM device further includes a write driver connected to each of the differential pair of bit lines in each of the plurality of SRAM cells of the memory array. The SRAM device further includes a write assist attenuation circuit connected to the write driver. The write assist attenuation circuit includes a clamping device comprising a first NFET, a second NFET, and a third NFET connected to a control signal. The write assist attenuation circuit further includes a logic structure configured to generate a first attenuation signal, a second attenuation signal, and a third attenuation signal. The first attenuation signal, the second attenuation signal, and the third attenuation signal are configured to individually activate either the first NFET, the second NFET, or the third NFET such that only one of the first NFET, the second NFET, and the third NFET modify the control signal as a function of a supply voltage and a process to attenuate an amount of boost applied to pull one of the plurality of true bit lines or one of the plurality of complement bit lines below ground in an active phase of a write cycle.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to memory devices and, more particularly, to an apparatus and method for implementing write assist with boost attenuation for SRAM arrays. More specifically, implementations of the invention provide for a negative boost write assist attenuation circuit with a clamping device that is configured to provide boost attenuation at higher supply voltages and faster process (e.g., in accordance with aspects of the present invention a higher supply voltage is understood to mean any voltages that are greater than the technology nominal voltage, and a faster process means devices operating faster than the technology nominal process) with less attenuation at lower supply voltages based on supply voltage and processes. In this manner, attenuation with clamping proportional to supply voltage and processes gives exponentially increased attenuation because of larger leakage, which advantageously provides a tunable negative boost write assist attenuation circuit that can either reduce attenuation or increase attenuation at particular voltages.

Figure 1:
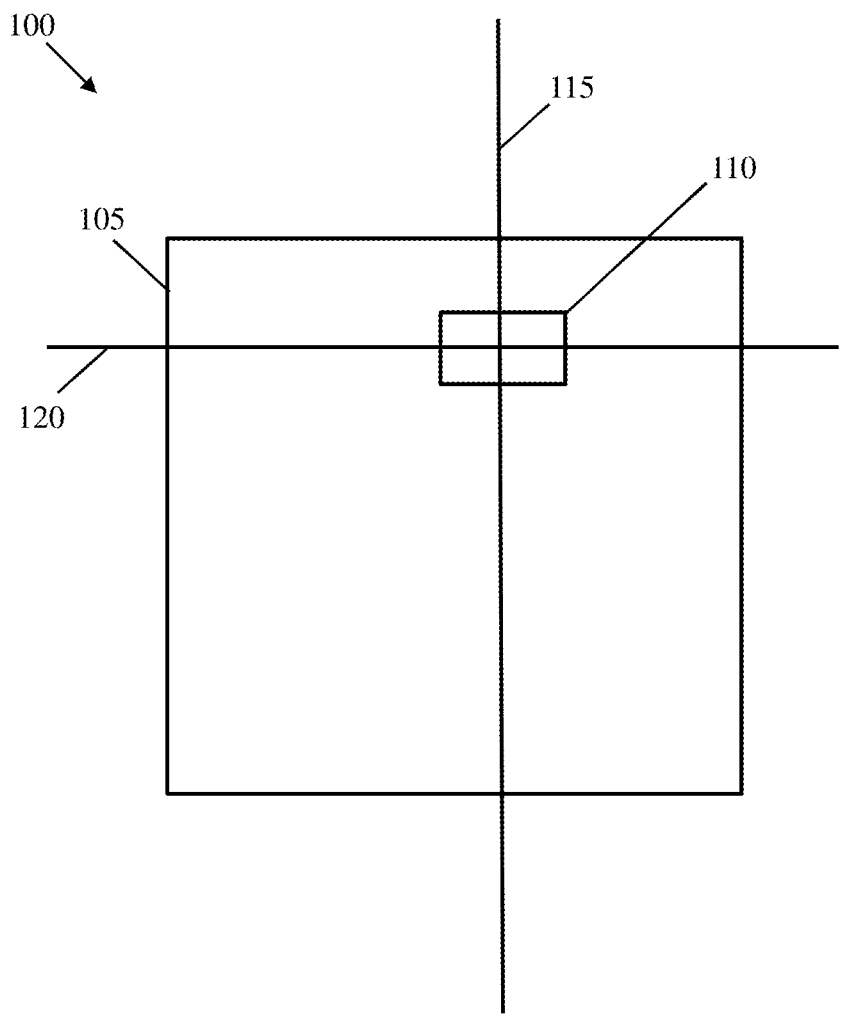
FIG. 1 shows a simplified block diagram of a memory array in accordance with aspects of the invention.

FIG. 1 shows a simplified block diagram of a memory 100 that includes a memory array 105. Memory array 105 comprises memory cells, such as memory cell 110, in which bits are stored. For ease of illustration, FIG. 1 shows only memory cell 110, however, memory array 105 would have memory cells arranged in each of its rows and columns. In embodiments, memory 100 is a SRAM. Although the description that follows for FIG. 1 and other figures is directed to an SRAM, those skilled in the art will recognize that embodiments described below are also suited for use with other memory devices such as DRAM. A typical SRAM cell includes a balanced pair of cross-coupled inverters storing a single data bit. A pair of pass gates (a balanced pair of field-effect transistors (FETs)) selectively connects the complementary outputs of the cross-coupled inverters to a corresponding complementary or differential pair of bit lines (e.g., bit line true and bit line complement). A word line connected to the gates of the pass gate FETs selects the memory cell 110 to the corresponding complementary pair of bit lines for performing an operation that may include a read or a write operation. The SRAM cell may be formed from cell designs that may include any number of transistors (e.g., 4T, 6T, 8T, etc.).

FIG. 1 does not illustrate a particular SRAM cell design; however, FIG. 1 shows a bit line 115 (representing bit line true and bit line complement) connecting to memory cell 110 through a column of memory array 105 and a word line 120 connecting to memory cell 110 through a row of memory array 105. As an example, an N row by M column SRAM array may be organized as N word lines by M column bit lines. In operation, the bit line pairs (e.g., bit line true and bit line complement) represented by bit line 115, are in standby and are clamped together to a supply or reference voltage. Accessing bit line 115 for a read or a write operation from memory array 105 entails driving one of the N word lines, e.g., turning on the pass gates for all memory cells 110 on that word line. With the pass gates on for that selected word line, the cross-coupled cell inverters are coupled to the corresponding bit line pairs, partially selecting the cells on that word line. Selection of one of the M columns selects the cells on that word line, with the bit lines of a particular cell actually being accessed. The remaining bit lines of the other cells in the column remain half selected during the access.

Those skilled in the art will recognize that memory cell 110 may include other elements than what is illustrated in FIG. 1. For example, memory cell 110 may include a sense amplifier for facilitating read operations and a write driver for facilitating write operations.

Figure 2:
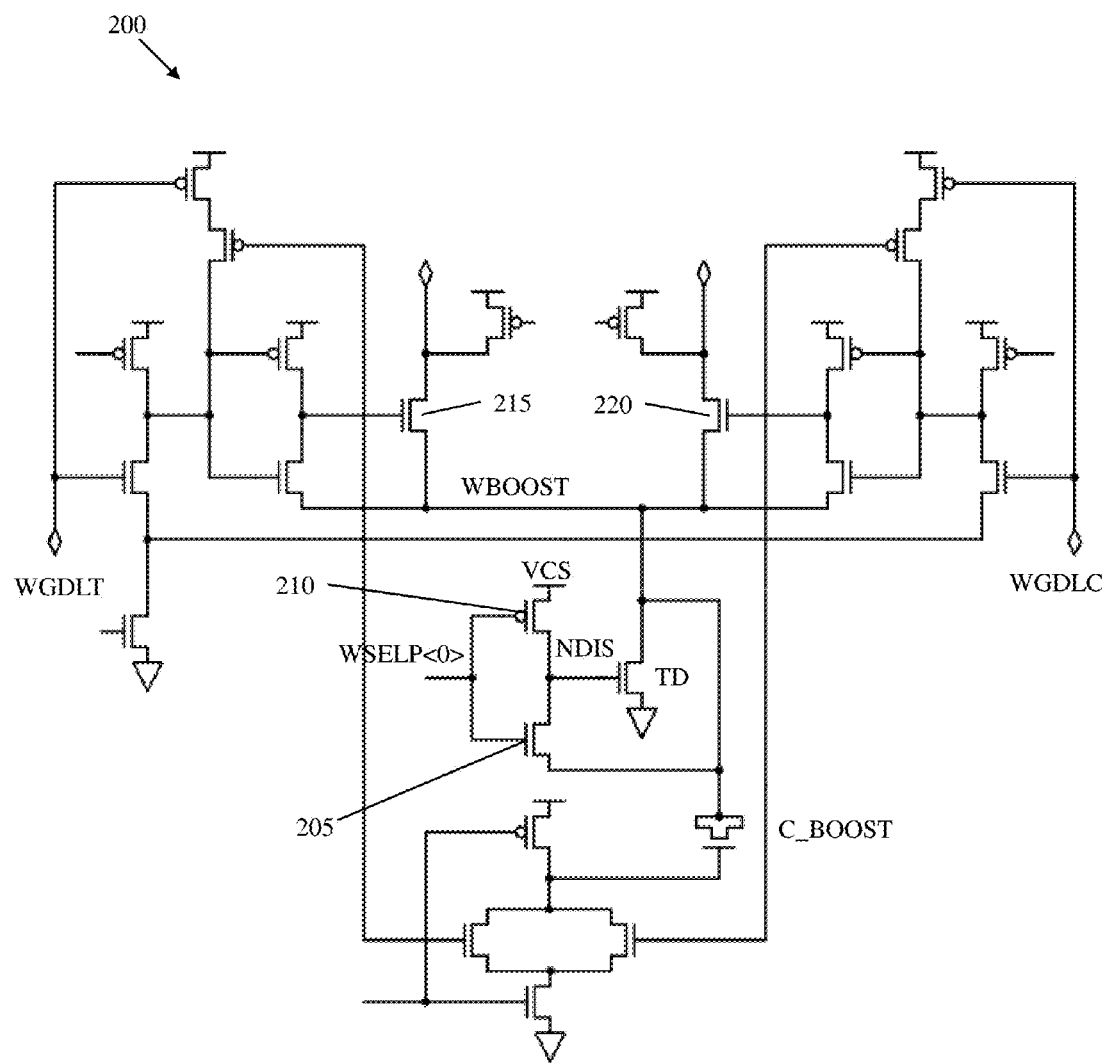
FIG. 2 shows a SRAM write driver in accordance with aspects of the invention.

FIG. 2 shows a conventional SRAM write driver 200 that may be implemented in memory cell 110 of FIG. 1. The SRAM write driver 200 is coupled to the bit line pairs (e.g., bit line true and bit line complement) represented by bit line 115 via bit switches (not shown). The bit line true may be formed from one or more true bit lines and the bit line complement may be formed from one or more complement bit lines. The bit switches, which are used to connect one of the bit lines (e.g., bit line true or bit line complement) to SRAM write driver 200, are formed from N-type field effect transistors (NFETs) with gates connected to the one or more true bit lines for bit line true and similar NFETs with gates connected to the one or more complement bit lines for bit line complement. Note that cross-coupled inverters described above for an SRAM cell would be coupled to each of the bit lines.

In a typical write operation, after a particular word line has been activated, one of the bit lines (e.g., bit line true) is brought to ground (GND), while the other bit line (e.g., bit line complement) is maintained at a supply voltage (VDD). This discharges the cell and facilitates a write to the cell. In particular, this enables the "1" side (e.g., bit line true) to change to a "0", allowing the cell to flip states. As shown in FIG. 2, a discharge device TD (an NFET) and a boost capacitor C_BOOST are used to discharge one of the bit lines (e.g., bit line true or bit line complement) below the nominal low supply rail value (e.g., ground). Capacitor C_BOOST is coupled to discharge device TD at a node WBOOST. The gate of discharge device TD, which is controlled by signal WSELP<0>, is coupled to capacitor C_BOOST via NFET 205 and PFET 210. Discharge device TD and capacitor C_BOOST are connected to bit switches, bit line true, and bit line complement via NFETs 215 and 220, which are controlled by data signals WGDLT and WGDLC, respectively.

However, notwithstanding the benefits of negative boosting, it has been determined that in instances where the supply voltage (VDD) is high (e.g., any voltages that are greater than the technology nominal voltage), the negative boosting may create stress within the SRAM write driver. For example, the gates of the FETs in the SRAM write driver are at VDD, while their sources go negative due to their coupling to the negative voltage node. If VDD is at about 1.1V (e.g., a higher VDD) while the source of one of these FETs goes to −300 millivolts (mV) during a boost below GND, then a 1.4V differential may arise at the gate-source terminal of the transistors. Over time it has been determined that such voltage levels create stress on the write driver (e.g., affect the gate oxide of the transistors) causing write driver reliability concerns.

Figure 3:
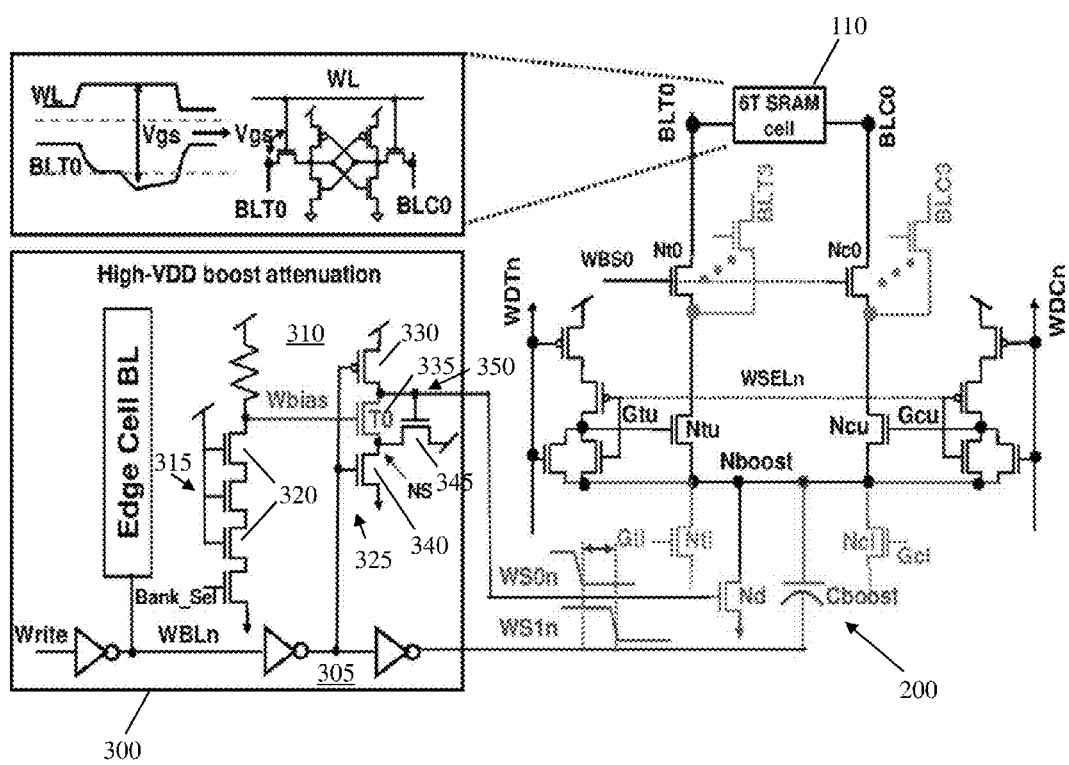
FIG. 3 shows a SRAM write assist circuit implemented with a SRAM write driver and memory cell in accordance with aspects of the invention.

FIG. 3 shows a conventional write assist circuit 300 that may be implemented in SRAM write driver 200 of FIG. 2 to overcome stress imparted on the writer driver by the negative boosting. The write assist circuit 300 enables SRAM write driver 200 to provide a full boost below GND at lower VDD levels; however, as the VDD levels increase, the write assist circuit 300 attenuates or limits the amount of boost. The write assist circuit 300 performs these functions by controlling a timing relationship between the discharge device TD and the capacitor C_BOOST. In particular, the write assist circuit 300 enables discharge device TD to shut off prior to initiating the boost provided by capacitor C_BOOST and slow the shutting off of the discharge device TD as the supply voltage VDD increases.

As shown in FIG. 3, the write assist circuit 300 comprises a boost control device 305 configured to control the amount of boost provided by capacitor C_BOOST as a function of VDD. A discharge device controller 310 is the part of the write assist circuit 300 that controls operation of discharge device TD, such that the operational relationship between discharge device TD and capacitor C_BOOST is timed to provide the full boost provided by capacitor C_BOOST to the bit line at lower VDD voltages, while at higher VDD voltages, attenuate the amount of boost. The discharge device controller 310 comprises a bias signal generator 315 (e.g., a resistor based BIAS scheme) that generates a WBIAS signal that is provided as function of VDD. The bias signal generator 315 comprises a stack of NFETs 320 coupled in series.

The discharge device controller 310 further comprises a switching stage 325 that is configured to control the timing of the shutting off of the discharge device TD in accordance with the BIAS signal generated from bias signal generator 315. In particular, switching stage 325 slows down the timing of shutting off discharge device TD (i.e., slows the transition of signal WSELP<0>) in the presence of a high VDD voltage. The switching stage 325 comprises a PFET 330 and two NFETs 335 and 340 coupled in series. In particular, the source of PFET 330 is coupled to supply voltage VDD, its drain is coupled to the drain of NFET 335 and its gate is controlled by signal WBLN. NFET 335 is controlled by the BIAS signal and its source forms a node NS with the drain of NFET 340 and the source of NFET 345. The gate of NFET 345 is controlled by the WBLN signal and the drain of NFET 345 is coupled to VDD. A node 350 is formed between the drain of PFET 330 and an input of SRAM write driver 200.

In operation, when the WBLN signal goes high, then NFET 335 is impacted because the WBIAS voltage is lowered and the voltage at the node 350 is increased. Essentially, because the node 350 is at VDD and the node NS is connected through NFET 345, more time is needed to discharge the node 350 to GND. The end result is that the switching provided by switching stage 310 slows down as VDD increases. This creates the timing relationship necessary to generate a response from additional logic (not shown) that keeps the WSELP<0> signal high during the boost. As mentioned above, this enables the boost at the higher VDD voltages to be attenuated through the discharge device TD.

Figure 4:
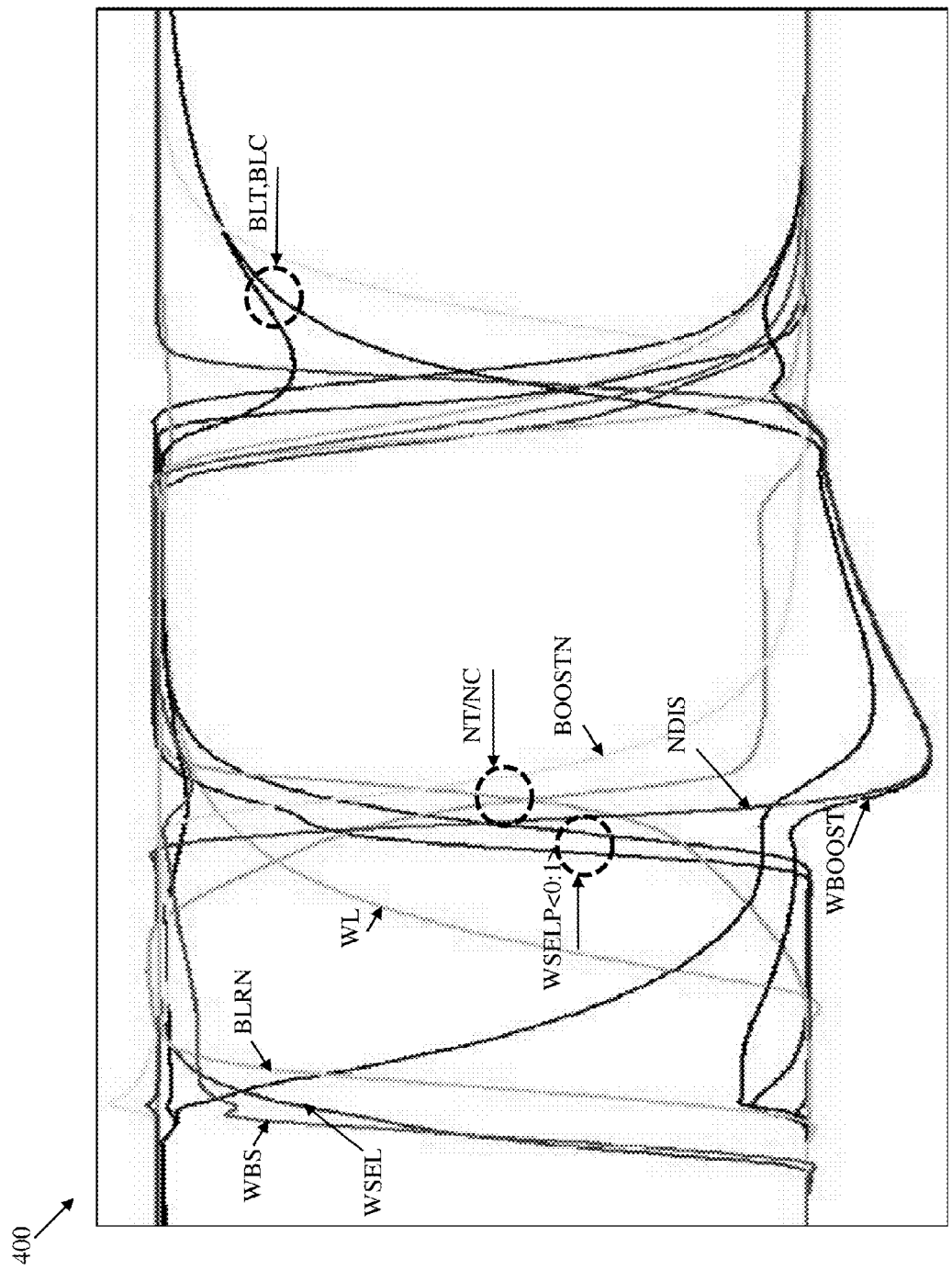
FIG. 4 shows a circuit timing diagram that describes the operation of the SRAM write assist circuit depicted in FIG. 3 in accordance with aspects of the invention.

FIG. 4 shows a simulation 400 of the discharge of a bit line (BLT) with the write assist circuit 300 depicted in FIG. 3. In particular, simulation 400 shows the transition of a bit line (BLT) from high to low, and then to the point where it receives a boost (WBOOST) below GND (e.g., 0 volts). As shown in FIG. 4, at lower VDD voltages (e.g., 0.7 volts and 0.8 volts), signals WSELP<0:1> transition at different times. This happens because the SRAM write assist circuit 300 is controlling the timing between discharge device TD and capacitor C_BOOST, so that discharge device TD is turned off before the boost is initiated. At higher VDD voltages, the relationship between signal WSELP<0> and signal WSELP<1> changes. The amount of separation between signals WSELP<0:1> determines the boosting value.

There are several disadvantages associated with the SRAM write assist circuit 300. For example, the SRAM write assist circuit 300 is based on complex logic implementations using analog techniques that work on small delay variations, which can disadvantageously vary on the silicon. Further, in instances in which bias temperature instability causes significant threshold voltage shifts in the FETs, the delays may be shifted and can behave differently such that either full attenuation is attained (concern for writability) or no attenuation is attained (concern for reliability). Consequently, yield variation for semiconductor devices can be observed with these techniques.

Figure 5:
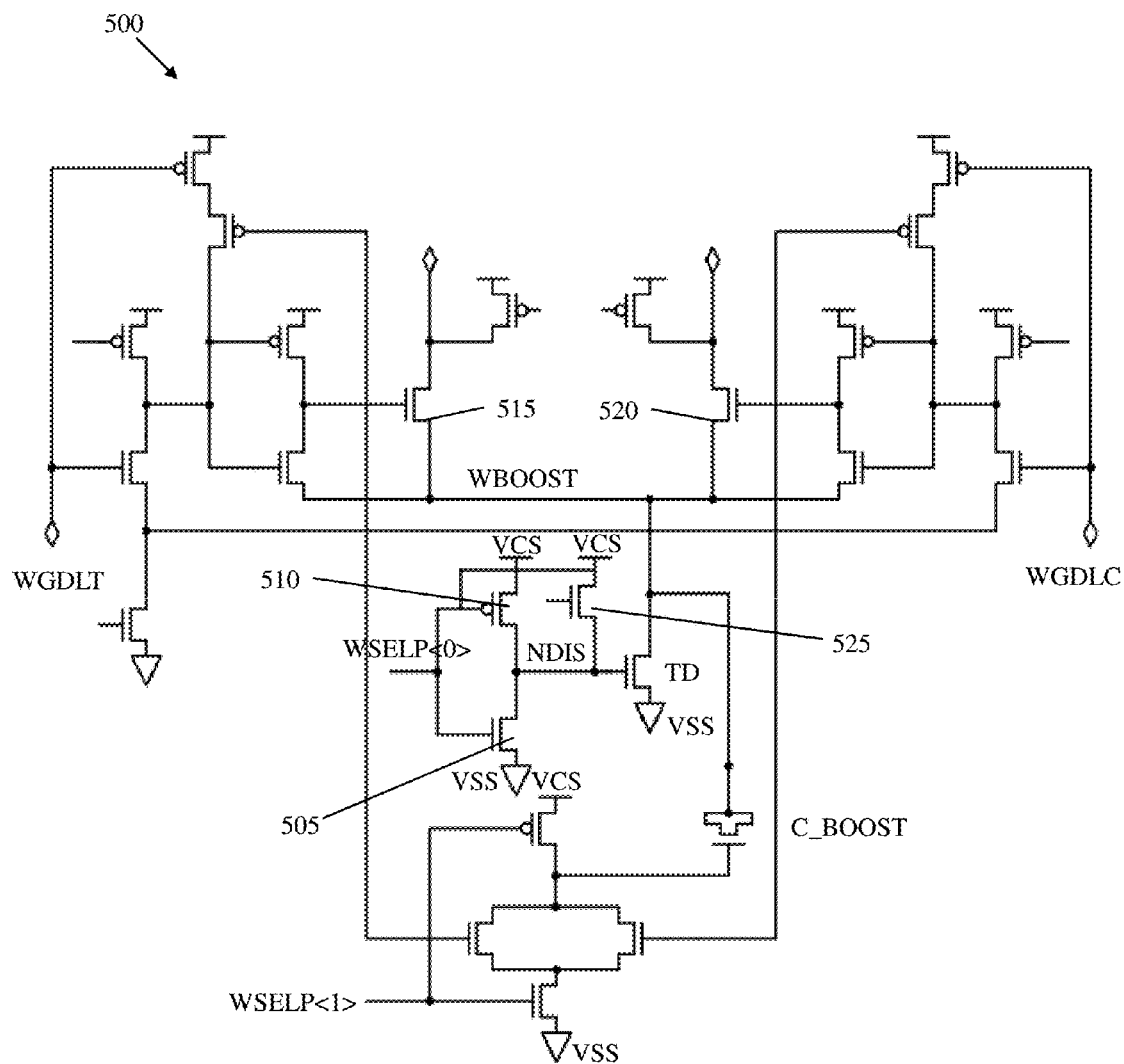
FIG. 5 shows a SRAM write driver along with a write assist attenuation circuit in accordance with aspects of the invention.

FIG. 5 shows a SRAM write driver 500 according to embodiments of the present invention that addresses the disadvantages associated with the SRAM write driver 200 of FIG. 2. In embodiments, the SRAM write driver 500 is coupled to the bit line pairs (e.g., bit line true and bit line complement) represented by bit line 115 depicted in FIG. 1 via bit switches (not shown). The bit line true may be formed from one or more true bit lines and the bit line complement may be formed from one or more complement bit lines. The bit switches, which are used to connect one of the bit lines (e.g., bit line true or bit line complement) to the SRAM write driver 500, are formed from N-type field effect transistors (NFETs) with gates connected to the one or more true bit lines for bit line true and similar NFETs with gates connected to the one or more complement bit lines for bit line complement. Note that cross-coupled inverters described above for an SRAM cell would be coupled to each of the bit lines.

In a typical write operation, after a particular word line has been activated, one of the bit lines (e.g., bit line true) is brought to ground (GND), while the other bit line (e.g., bit line complement) is maintained at a supply voltage (VDD). This discharges the cell and facilitates a write to the cell. In particular, this enables the "1" side (e.g., bit line true) to change to a "0", allowing the cell to flip states. As shown in FIG. 5, a discharge device TD (an NFET) and a boost capacitor C_BOOST are used to discharge one of the bit lines (e.g., bit line true or bit line complement). Capacitor C_BOOST is coupled to discharge device TD at a node WBOOST (e.g., a negative boost node) and controlled by signal WSELP<1>. The gate of discharge device TD, which is controlled by signal WSELP<0>, is coupled to capacitor C_BOOST via NFET 505 and PFET 510. Discharge device TD and capacitor C_BOOST are connected to bit switches, bit line true, and bit line complement via NFETs 515 and 520, which are controlled by data signals WGDLT and WGDLC, respectively.

In embodiments, the SRAM write driver 500 further comprises NFET 525. The drain of NFET 525 is connected to the gate of discharge device TD, the source of NFET 525 is connected to array supply voltage (VCS), and the gate of NFET 525 is connected to WSELP<0>. The source of PFET 505 is connected to VCS, the drain of PFET 510 is connected to the gate of discharge device TD, and the gate of PFET 505 is connected to WSELP<0>. The source of NFET 505 is connected to voltage source (VSS) (e.g., 0 v) instead of the WBOOST node (e.g., as shown in FIG. 2), the drain of NFET 505 is connected to the gate of discharge device TD, and the gate of NFET 505 is connected to WSELP<0>. Consequently, NFET 505, NFET 525, and discharge device TD are configured as high voltage devices and capacitor C_BOOST is configured as a low voltage device. The discharge device TD acts like a diode and functions to clamp WBOOST from going very negative (e.g., a BOOSTMIN of about −250 mv). The NFET 525 competes with the NFET 505 and functions to clamp the n-channel metal-oxide-semiconductor field-effect transistor (NMOS) disable (NDIS) signal or voltage. The clamping of the NDIS signal is controllable and allows for attenuation of WBOOST in accordance with aspects of the present invention, as discussed in detail herein.

Figure 6:
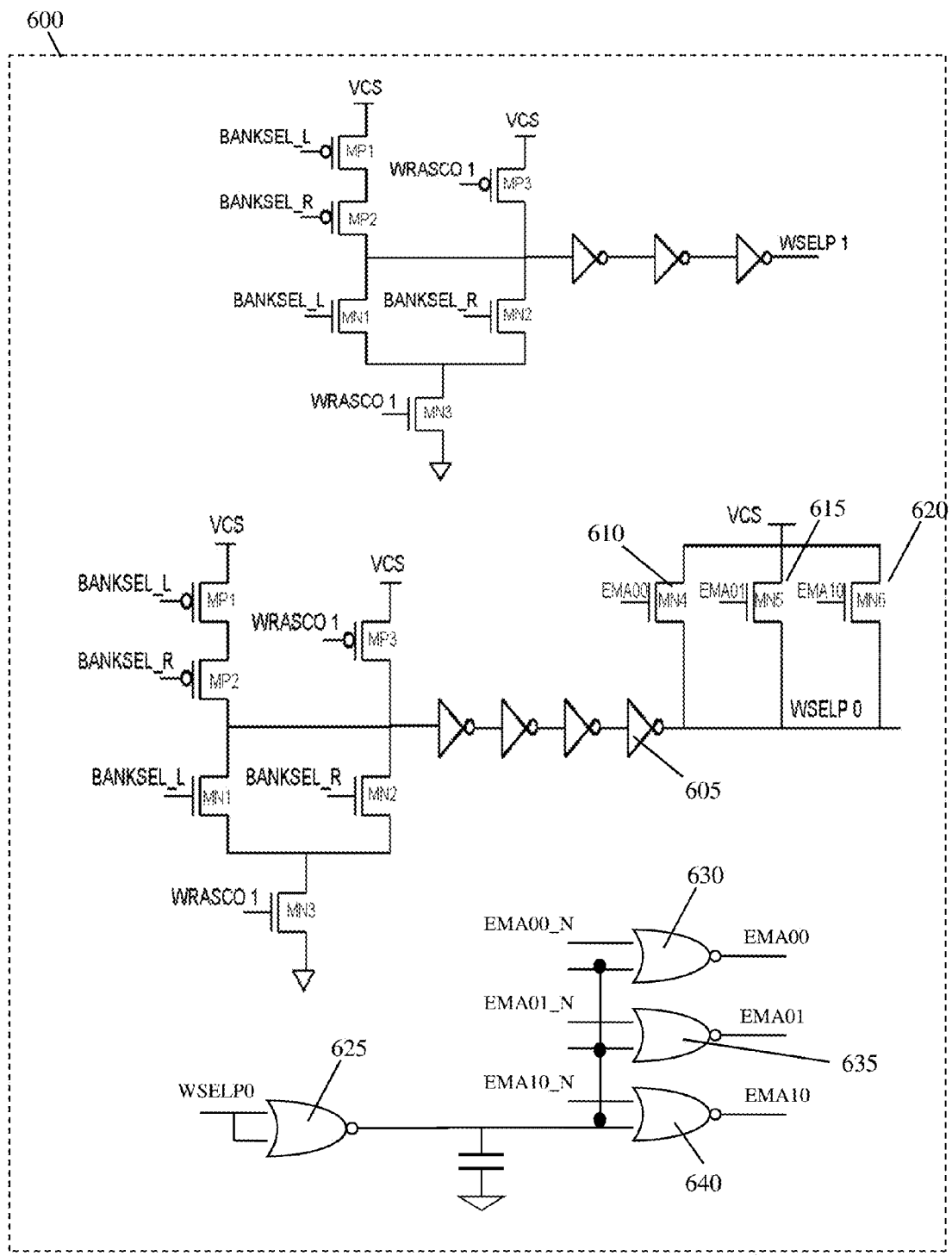
FIG. 6 shows a SRAM write assist attenuation circuit in accordance with aspects of the invention.

Advantageously, in additional or alternative embodiments, the configuration of NFET 505, PFET 510, and NFET 525 (e.g., a clamping device) can be moved out of the SRAM write driver 500 and into a write assist attenuation circuit 600 depicted in FIG. 6. In particular, FIG. 6 shows NFET 505 and PFET 510 depicted as inverter 605 (e.g., an inverter comprising PFET and NFET) and NFET 525 depicted as NFET 610, NFET 615, or NFET 620 (e.g., a clamping device that can be programmed) within the write assist attenuation circuit 600. The source of NFET 610 is connected to WSELP<0>, the drain of NFET 610 is connected to VCS, and the gate of NFET 610 is connected to signal EMA00. The source of NFET 615 is connected to WSELP<0>, the drain of NFET 615 is connected to VCS, and the gate of NFET 615 is connected to signal EMA01. The source of NFET 620 is connected to WSELP<0>, the drain of NFET 620 is connected to VCS, and the gate of NFET 620 is connected to signal EMA10.

In embodiments, signal WSELP<0> is processed by OR gate 625 to generate a pulsed signal that is further processed by OR gates 630, 635, and 640 ORing with EMA00_N, EMA01_N and EMA10_N (generation of EMA00_N, EMA01_N and EMA10_N is not shown in FIG. 6) to generate signals EMA00, EMA01, and EMA10, respectively. As such, the pulse signal generated by the OR gate 626 is added onto signals EMA00, EMA01, and EMA10, which enables clamping of the NDIS signal until and during the boosting and allows for the NDIS signal to go to GND after the boosting, as discussed in further detail hereafter with respect to FIGS. 9, 10A, 10B, and 11.

Each of the signals EMA00, EMA01, and EMA10 are operable to be input into the NFETs 610, 615, and 620, respectively, to control which NFET is activated. The channel widths of each of the NFETs 610, 615, and 620 are fabricated differently (e.g., the channel width may be setup such that NFET 615<NFET 610<NFET 620) in order to provide different leakage current, and thus control clamping of the signal WSELP<0> at different voltages allow for attenuation of WBOOST. In this manner, attenuation with clamping proportional to supply voltage and processes gives exponentially increased attenuation because of larger leakage, which advantageously provides a tunable negative boost write assist attenuation circuit that can either reduce attenuation or increase attenuation at particular voltages.

Figures 7, 8:
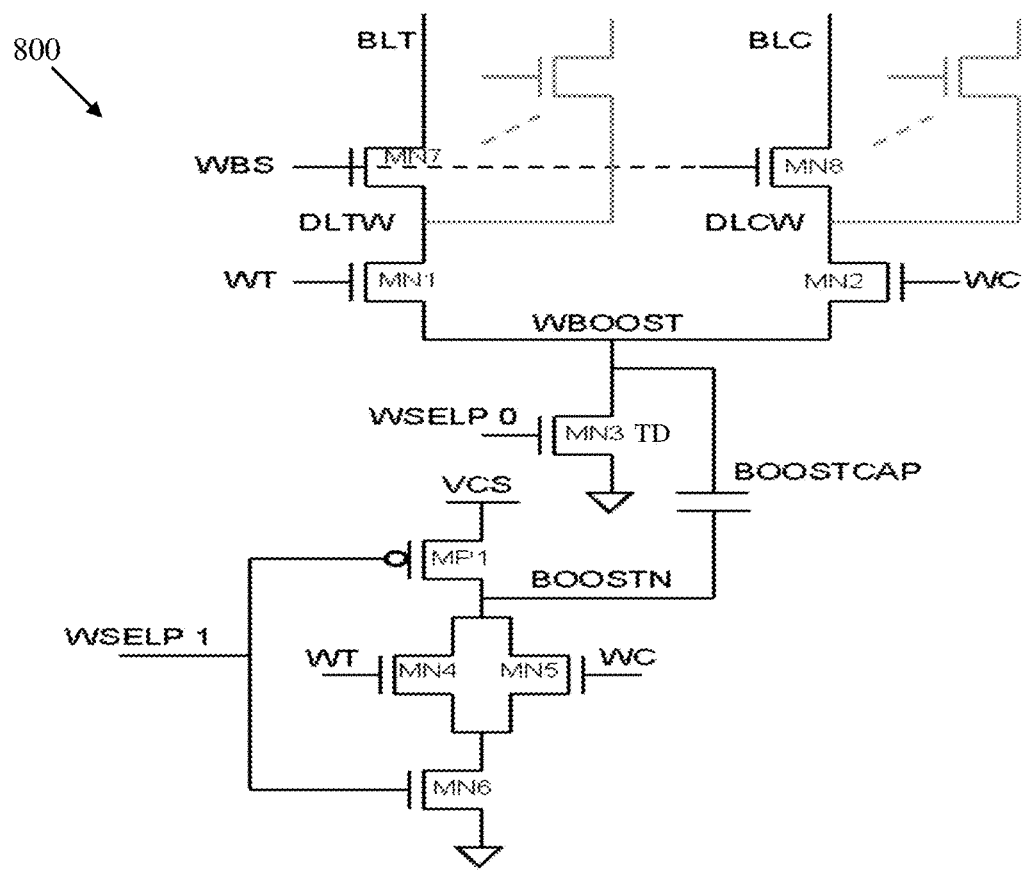
FIG. 7 shows a logic table that describes the operation of the SRAM write assist attenuation circuit depicted in FIG. 6 in accordance with aspects of the invention.
FIG. 8 shows a SRAM write driver in accordance with aspects of the invention.

FIG. 7 shows a attenuation table 700 that illustrates functionality of signals EMA00, EMA01, and EMA10 to individually activate the NFETs 610, 615, and 620 depicted in FIG. 6 in accordance with aspects of the present invention. In particular, FIG. 7 shows that EMA00 may be configured to activate NFET 610, which in embodiments has a channel width configured to clamp the NDIS signal in such a manner that default attenuation of WBOOST is achieved. EMA01 may be configured to activate NFET 615, which in embodiments has a channel width configured to clamp the signal WSELP<0> in such a manner that lesser attenuation of WBOOST is achieved. EMA10 may be configured to activate NFET 620, which in embodiments has a channel width configured to clamp the signal WSELP<0> in such a manner that larger attenuation of WBOOST is achieved. Lastly, EMA11 may be configured to activate the NFET 610 with default attenuation along with pushed out Boost timing.

Advantageously, in embodiments, the moving of NFET 505, PFET 510, and NFET 525 depicted in FIG. 5 to the write assist attenuation circuit 600 depicted in FIG. 6 as inverter 605 and NFETs 610, 615, and 620 frees up semiconductor area within the SRAM write driver 800, as depicted in FIG. 8. In particular, FIG. 8 shows that the signal WSELP<0> modified by either of NFET 610, 615, or 620, or WSELP<0> asserted without modification from either of NFETs 610, 615, and 620 is directly input into the gate of discharge device TD. Accordingly, the discharge device acts like a diode and functions to clamp WBOOST dependent upon either of signals EMA00, EMA01, EMA10, or EMA11.

Figure 9:
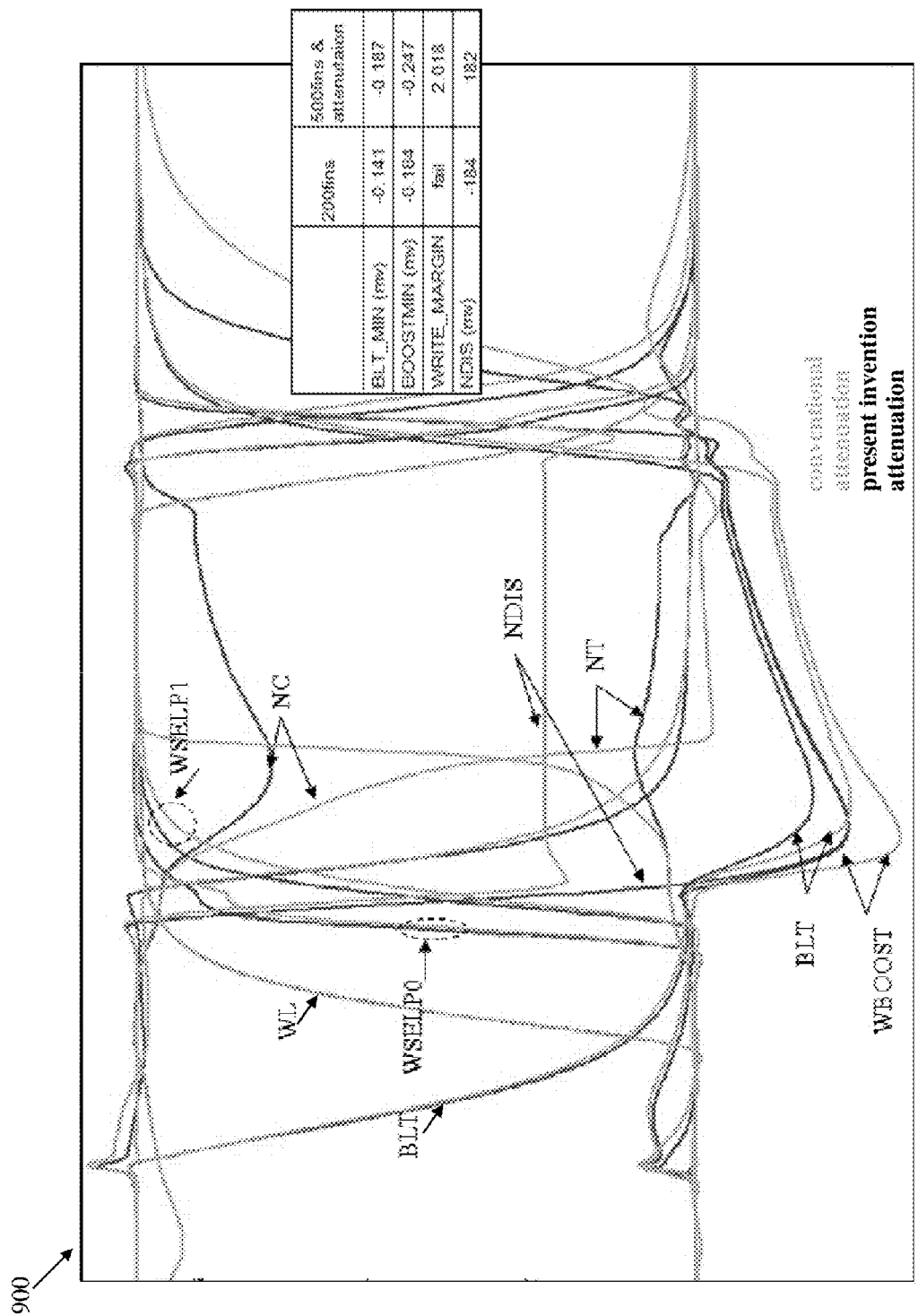
FIGS. 9, 10A, 10B, and 11 show circuit timing diagrams that describe the operation of the SRAM write assist attenuation circuit depicted in FIG. 6 in accordance with aspects of the invention.

FIG. 9 shows a simulation 900 of the discharge of a bit line (BLT) with the write assist attenuation circuit 600 depicted in FIG. 6. In particular, simulation 900 shows the transition of a bit line (BLT) from high to low, and then to the point where it receives a boost (WBOOST) below GND (e.g., 0 volts). As shown in FIG. 9, in contrast to conventional schemes where the NDIS signal follows BLT below GND, in embodiments of the present invention, the NDIS signal is clamped above GND, which results in attenuation of WBOOST similar to that of conventional attenuation discussed herein based on timing of the WSELP<0:1>. This happens because the write assist attenuation circuit 600 is controlling the signals EMA00, EMA01, EMA10, or EMA11 to modify or not modify WSELP<0>.

Figure 10A:
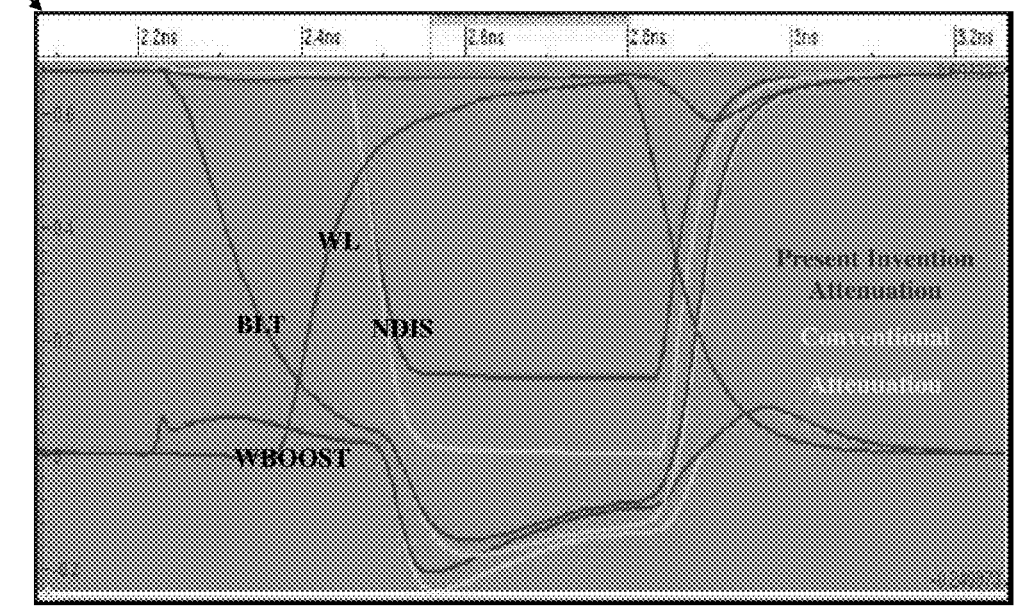
Figure 10B:
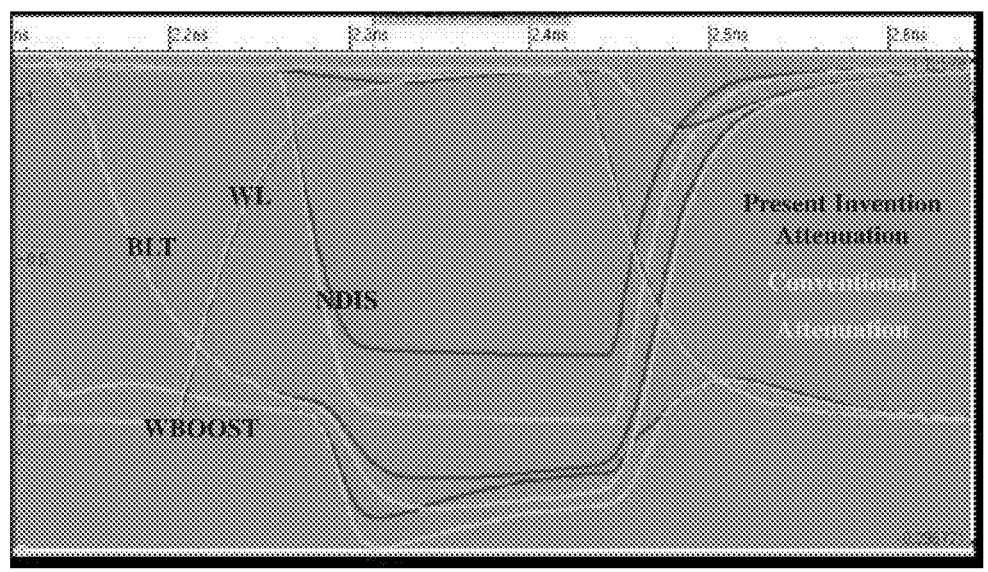

FIGS. 10A and 10B show low voltage simulation 1000 and high voltage simulation 1100, respectively, of the discharge of a bit line (BLT) with the write assist attenuation circuit 600 depicted in FIG. 6. In particular, simulations 1000 and 1100 show the transition of a bit line (BLT) from high to low, and then to the point where it receives a boost (WBOOST) below GND (e.g., 0 volts). As shown in FIG. 10A, the NDIS signal is variably clamped above GND, which results in attenuation of WBOOST to a BOOST_MIN of −208 mv compared to a BOOST_MIN of −239 mv achieved by a conventional scheme for low voltage writing. As shown in FIG. 10B, the NDIS signal is variably clamped above GND, which results in attenuation of WBOOST to a BOOST_MIN of −303 mv compared to a BOOST_MIN of −394 mv achieved by a conventional scheme for high voltage writing.

Figure 11:
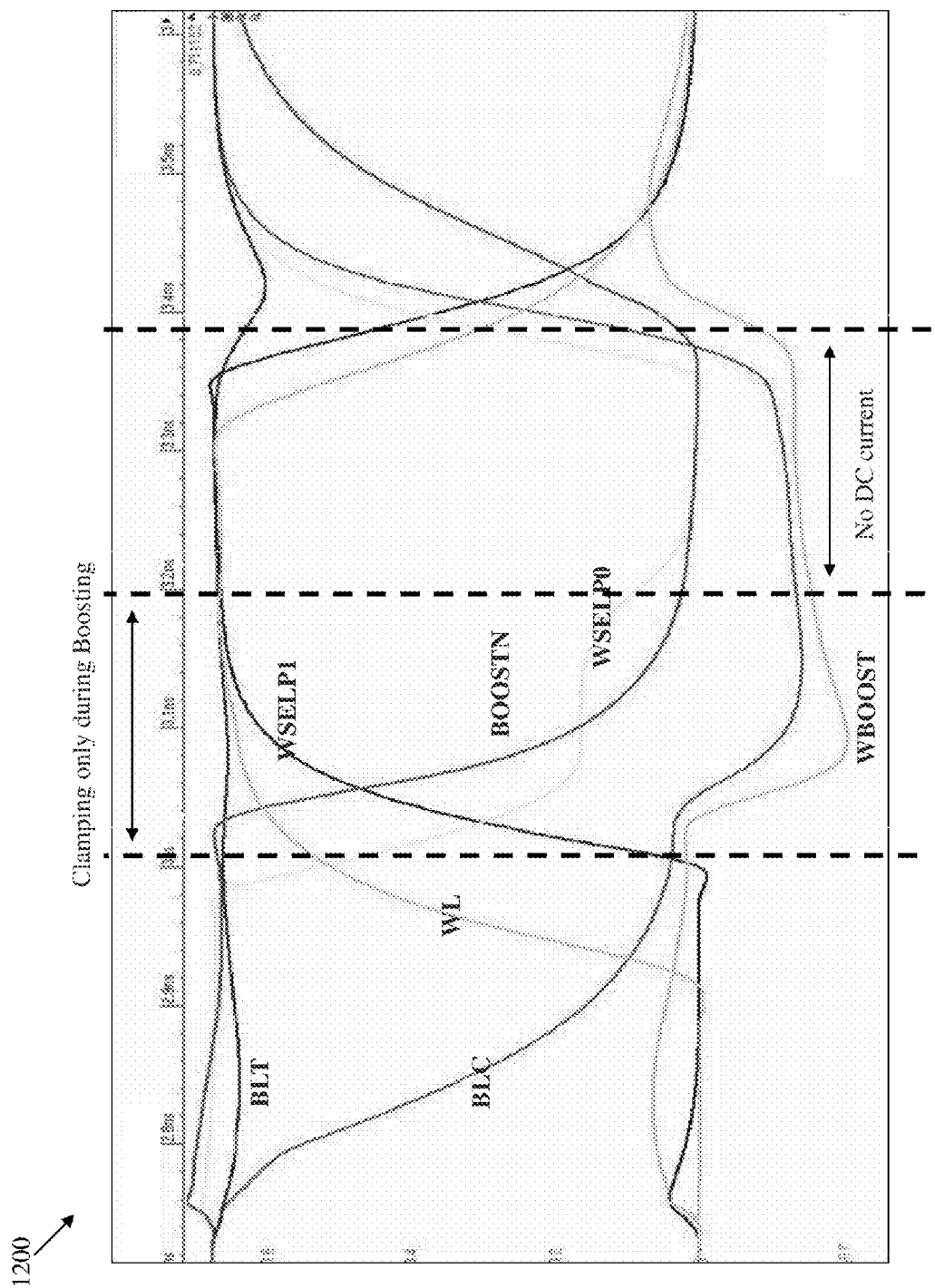

FIG. 11 shows a simulation 1200 of the discharge of a bit line (BLC) with the write assist attenuation circuit 600 depicted in FIG. 6. In particular, simulation 1200 shows the transition of a bit line (BLC) from high to low, and then to the point where it receives a boost (WBOOST) below GND (e.g., 0 volts). As shown in FIG. 11, the clamping of the NDIS signal is controllable via the write assist attenuation circuit 600 such that clamping only occurs during the boost (WBOOST) and returns the NDIS signal to GND after application of the boost (WBOOST). Advantageously, in embodiments, this controlled clamping results in no DC current being used while bit line (BLC) returns to a high state, and thus achieves significant power savings during each write cycle to a memory array.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
a memory array comprising a plurality of static random access memory (SRAM) cells;
a plurality of true bit lines each connected to a column of the memory array;
a plurality of complement bit lines each forming a differential pair with, and in a same column as, one of the plurality of true bit lines;
a write driver connected to each of the differential pair of bit lines in each of the plurality of SRAM cells of the memory array, the write driver comprising:
a negative boost node;
a discharge device coupled to ground and the negative boost node, the discharge device configured to receive a control signal and pull one of the plurality of true bit lines or one of the plurality of complement bit lines to ground in an active phase of a write cycle; and
a boost capacitor coupled to the negative boost node, the boost capacitor configured to boost the one of the plurality of true bit lines or the one of the plurality of complement bit lines below ground; and
a write assist attenuation circuit connected to the discharge device, the write assist attenuation circuit comprising a clamping device comprising an inverter, a first NFET, a second NFET, and a third NFET, each having a source-drain path connected to an output of the inverter which supplies the control signal to the source-drain paths of the first NFET, second NFET and third NFET, respectively, the clamping device being configured to modify the control signal as a function of supply voltage and process to attenuate an amount of the boost, and each of the first NFET, the second NFET, and the third NFET being connected to a first attenuation signal, a second attenuation signal, and a third attenuation signal, respectively,
wherein the source-drain paths of the first NFET, the second NFET and the third NFET are connected in parallel with one another between the supply voltage and the output of the inverter.

2. The device of claim 1, wherein a source of the first NFET is connected to the control signal, a drain of the first NFET is connected to an array supply voltage, and a gate of the first NFET is connected to the first attenuation signal.

3. The device of claim 2, wherein a source of the second NFET is connected to the control signal, a drain of the second NFET is connected to the array supply voltage, and a gate of the second NFET is connected to the second attenuation signal.

4. The device of claim 3, wherein a source of the third NFET is connected to the control signal, a drain of the third NFET is connected to the array supply voltage, and a gate of the third NFET is connected to the third attenuation signal.

5. The device of claim 4, wherein the first attenuation signal, the second attenuation signal, and the third attenuation signal are generated from a logic structure comprising a plurality of OR gates, and are configured to individually activate either the first NFET, the second NFET, or the third NFET such that only one of the first NFET, the second NFET, and the third NFET modify the control signal as a function of the supply voltage and the process to attenuate the amount of the boost.

6. The device of claim 5, wherein a width of the channel of each of the first NFET, the second NFET, and the third NFET is different such that each of the first NFET, the second NFET, and the third NFET modifies the control signal in a different manner.

7. The device of claim 6, wherein the width of the channel of the second NFET is less than the width of the channel of the first NFET, and the width of the channel of the first NFET is less than the width of the channel of the third NFET.

8. The device of claim 7, wherein the logic structure comprises an OR gate configured to generate a pulsed signal on the first attenuation signal, the second attenuation signal, and the third attenuation signal to allow for clamping of a signal until and during the boost and allow for the signal to proceed to ground after the boost.

9. A device, comprising:
a memory array comprising a plurality of memory cells;
a plurality of true bit lines each connected to a column of the memory array;

a plurality of complement bit lines each forming a differential pair with, and in a same column as, one of the plurality of true bit lines;

a write driver connected to each of the differential pair of bit lines in each of the plurality of memory cells of the memory array, the write driver comprising:

a negative boost node;

a discharge device coupled to ground and the negative boost node, the discharge device configured to receive a control signal and pull one of the plurality of true bit lines or one of the plurality of complement bit lines to ground; and a boost capacitor coupled to the negative boost node, the boost capacitor configured to boost the one of the plurality of true bit lines or the one of the plurality of complement bit lines below ground; and a write assist attenuation circuit connected to the discharge device, the write assist attenuation circuit comprising a clamping device comprising a first NFET, a PFET, and a second NFET, a source of the first NFET being connected to a voltage source, a drain of the first NFET being connected to the discharge device, and a gate of the first NFET being connected to the control signal, a source of the PFET being connected to an array supply voltage, a drain of the PFET being connected to the discharge device, and a gate of the PFET being connected to the control signal, and a source of the second NFET being connected to the array supply voltage, and a drain of the second NFET being connected to the discharge device, such that the PFET and the second NFET are connected in parallel to one another between the array supply voltage and the discharge device, and a gate of the second NFET being connected to the control signal, wherein a source-drain path of the second NFET is connected between the discharge device and a common node connecting source-drain paths of the first NFET and the PFET, wherein the memory cells are static random access memory cells, wherein the discharge device is comprised of an NFET configured to act like a diode, and wherein the source-drain paths of the first NFET, the PFET and the second NFET are commonly connected to a gate of the NFET comprising the discharge device.

10. The device of claim 9, wherein the discharge device is configured to pull one of the plurality of true bit lines or one of the plurality of complement lines to ground in an active phase of a write cycle.

11. The device of claim 10, wherein the boost capacitor is coupled to a drain of the NFET comprising the discharge device.

* * * * *